United States Patent
Jeon et al.

(10) Patent No.: US 8,531,328 B2
(45) Date of Patent: Sep. 10, 2013

(54) ANALOG DIGITAL CONVERTER

(75) Inventors: Young-deuk Jeon, Daejeon (KR); Young Kyun Cho, Daejeon (KR); Jaewon Nam, Daejeon (KR); Jong-Kee Kwon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 182 days.

(21) Appl. No.: 13/243,267

(22) Filed: Sep. 23, 2011

(65) Prior Publication Data

US 2012/0146830 A1    Jun. 14, 2012

(30) Foreign Application Priority Data

Dec. 13, 2010   (KR) .................. 10-2010-0127115

(51) Int. Cl.
*H03M 1/12* (2006.01)
(52) U.S. Cl.
USPC ........... 341/172; 341/156; 341/161; 341/162; 341/163

(58) Field of Classification Search
USPC .................. 341/156, 161–163, 172
See application file for complete search history.

(56) References Cited

U.S. PATENT DOCUMENTS

| | | | |
|---|---|---|---|
| 2010/0066583 A1* | 3/2010 | Jeon et al. | 341/161 |
| 2010/0156692 A1* | 6/2010 | Jeon et al. | 341/162 |
| 2011/0241912 A1* | 10/2011 | Doris et al. | 341/110 |

OTHER PUBLICATIONS

Ba Ro Saim Sung et al., "A Time-Interleaved Flash-SAR Architecture for High Speed A/D Conversion", 2009 IEEE International Symposium on Circuits and Systems—Iscas 2009, 2009, pp. 984-987, Curran Associates Inc, Red Hook, New York.

* cited by examiner

*Primary Examiner* — Khai M Nguyen (57) ABSTRACT

Provided is an analog digital converter (ADC). The ADC includes: a capacitor array generating a level voltage; a comparator outputting a compare signal by comparing the level voltage; and a logic circuit determining digital bits of an analog signal based on the compare signal, wherein the logic circuit determines at least one digital bit among digital bits of the analog signal while a sampling operation of the analog signal is performed in the capacitor array.

13 Claims, 6 Drawing Sheets

ANALOG DIGITAL CONVERTER

CROSS-REFERENCE TO RELATED APPLICATIONS

This U.S. non-provisional patent application claims priority under 35 U.S.C. §119 of Korean Patent Application No. 10-2010-0127115, filed on Dec. 13, 2010, the entire contents of which are hereby incorporated by reference.

BACKGROUND OF THE INVENTION

The present invention disclosed herein relates to an analog digital converter (ADC), and more particularly, to a Successive Approximation Register (SAR) ADC.

Recently, as a mixed-mode system is increasingly used, an ADC becomes more necessary. Especially, researches on fabricating one chip at a low price through a Complementary Metal-Oxide Semiconductor (CMOS) process in a system such as a Digital Video Disk Player (DVDP) or a Direct Broadcasting for Satellite Receiver (DRSR) are actively in progress. For this, a design technology of the ADC capable of directly processing a Radio Frequency (RF) signal becomes the biggest issue.

Various types of ADCs are suggested until now. For example, a flash ADC, a pipeline ADC, and an SAR ADC are introduced and are used in application fields according to their characteristics. The flash ADC operates at a relatively high speed but has an area increased by $2^N$ according to its resolution. The pipeline ADC has a fast operating characteristic and supports a high resolution but has high power consumption. The SAR ADC has low power consumption and a simple circuit configuration but operates at a relatively slow speed.

SUMMARY OF THE INVENTION

The present invention provides an analog digital converter (ADC) guaranteeing a fast operating characteristic.

Embodiments of the present invention provide ADCs including: a capacitor array generating a level voltage; a comparator outputting a compare signal by comparing the level voltage; and a logic circuit determining digital bits of an analog signal based on the compare signal, wherein the logic circuit determines at least one digital bit among digital bits of the analog signal while a sampling operation of the analog signal is performed in the capacitor array.

In some embodiments, the ADCs may further include a connection circuit connected between the comparator and an input node of the analog signal, wherein the connection circuit is turned on while the sampling operation of the analog signal is performed in the capacitor array.

In other embodiments, the ADCs may further include: a first connection circuit connected between the comparator and an input node of the analog signal; and a second connection circuit connected between the comparator and the capacitor array, wherein the first connection circuit is turned on and the second connection circuit is turned off while the sampling operation of the analog signal is performed in the capacitor array.

In still other embodiments, after the sampling operation of the analog signal may be completed in the capacitor array, the first connection circuit is turned off and the second connection circuit is turned on.

In even other embodiments, the ADCs may further include a sub analog digital converting circuit connected to an input node of the analog signal and the logic circuit, wherein the sub analog digital converting circuit determines at least one bit of digital bits of the analog signal while the sampling operation of the analog signal is performed in the capacitor array.

In yet other embodiments, the sub analog digital converting circuit may be realized with a flash ADC.

In further embodiments, the capacitor array may include: a plurality of capacitors sampling the analog signal; and a plurality of switches connected to the plurality of capacitors, wherein after a sampling operation is completed, the plurality of switches selectively connect the plurality of capacitors to input nodes of first and second reference voltages to generate the level voltage.

In other embodiments of the present invention, ADCs include: a first successive approximation register (SAR) ADC converting an analog input signal into a digital signal of a predetermined bit; and a second SAR ADC converting a reaming voltage of the first SAR ADC into a digital signal of a predetermined bit, wherein the first SAR ADC converts the analog input signal into a digital signal while a sampling operation of the analog input signal is performed; and the second SAR ADC converts the remaining voltage into a digital signal while a sampling operation of the remaining voltage is performed.

In some embodiments, the first and second SAR ADCs may generate a sub analog digital converting path supporting an analog digital converting operation while a sampling operation is performed and a main analog digital converting path supporting an analog digital converting operation after a sampling operation is performed, respectively.

In other embodiments, while a sampling operation is performed, the main analog digital converting path of the first and second SAR ADCs may be cut off In still other embodiments, after a sampling operation is completed, the sub analog digital converting path of the first and second SAR ADCs may be cut off.

In even other embodiments, the first and second SAR ADCs may perform an analog digital converting operation using respective comparators while a sampling operation is performed.

In yet other embodiments, the first and second SAR ADCs may perform an analog digital converting operation using respective flash ADCs while a sampling operation is performed.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

Figure 1:
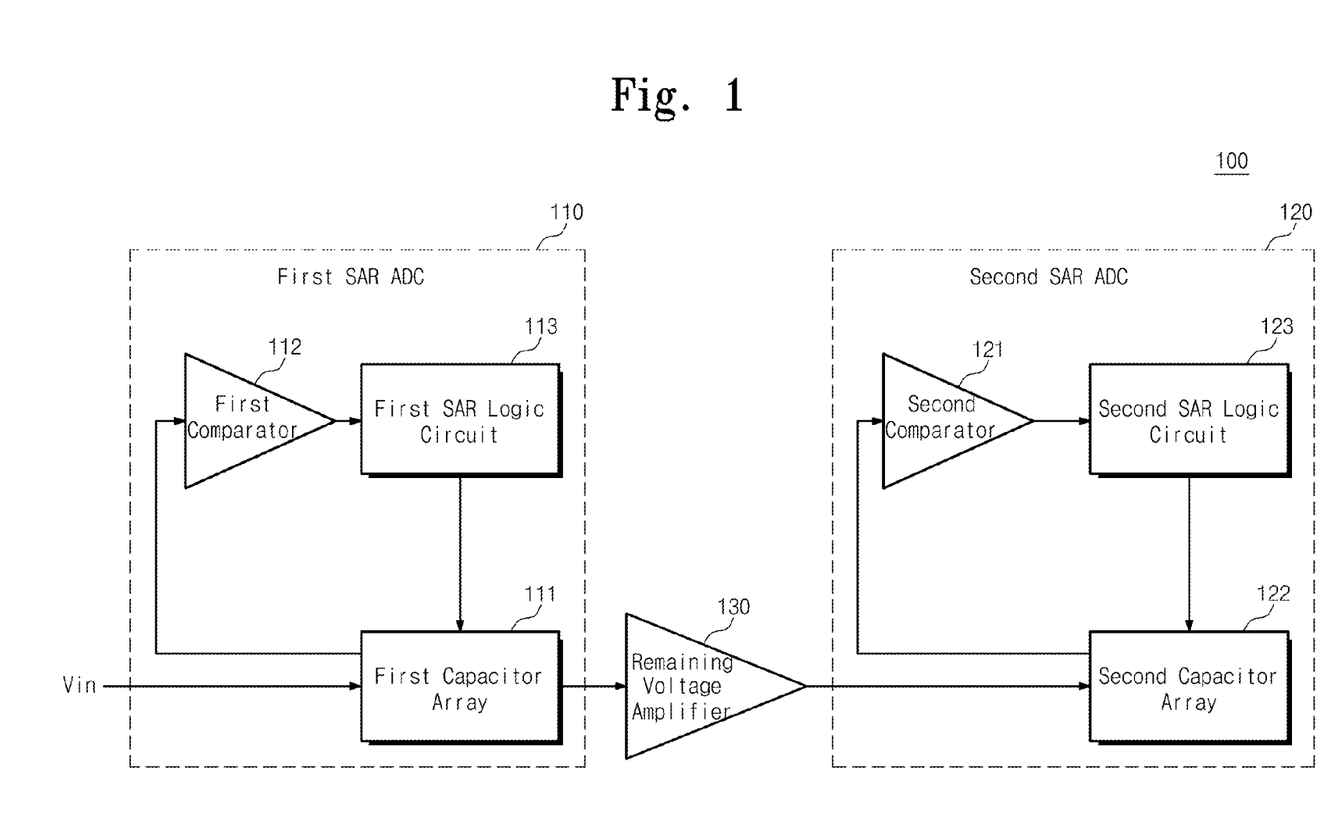
FIG. 1 is a block diagram illustrating a multistage Successive Approximation Register (SAR) Analog Digital Converter (ADC) according to an embodiment of the present invention.

FIG. 1 is a block diagram illustrating a multistage Successive Approximation Register (SAR) Analog Digital Converter (ADC) according to an embodiment of the present invention. Exemplarily, a 2 stage SAR ADC is shown in FIG. 1. Referring to FIG. 1, the multistage SAR ADC 100 includes a first SAR ADC 110, a second SAR ADC 120, and a remaining voltage amplifier 130.

The first SAR ADC 110 includes a first capacitor array 111, a first comparator 112, and a first SAR logic circuit 113. Similar to this, the second SAR ADC 120 includes a second capacitor array 121, a second comparator 122, and a second SAR ADC logic circuit 123.

In the first and second SAR ADCs 110 and 120, the first and second capacitor arrays 111 and 121 receive an analog input voltage Vin and an output voltage of the remaining voltage amplifier 130, respectively. Each of the first and second capacitor arrays 111 and 121 includes a plurality of capacitors (not shown). The first and second capacitor arrays 111 and 121 stores the received analog input voltage Vin and output voltage of the remaining voltage amplifier 130 in the capacitors, respectively. An operation for storing an analog input voltage Vin and an output voltage of the remaining voltage amplifier 130 may be referred to as a sampling operation.

Additionally, each of the first and second capacitor arrays 111 and 121 generates a level voltage. Here, a level voltage is a value for determining a level of a received analog input voltage Vin and also is a value divided appropriately according to a digital resolution of the ADC. That is, the capacitors of the first and second capacitor arrays 111 and 121 may have respectively different capacitances and the first and second capacitor arrays 111 and 121 generate a level voltage using a charge redistribution method.

The first and second comparators 111 and 121 receive level voltages generated in the first and second capacitor arrays 112 and 122. The first and second comparators 111 and 121 compare a level voltage with a predetermined voltage (e.g., a ground) to output a high or low signal.

The first and second SAR logic circuits 113 and 123 receive respective signals generated in the first and second comparators 112 and 122 and convert an analog input voltage Vin into a digital signal through the received signals.

The remaining voltage amplifier 130 is connected between the first SAR ADC 110 and the second SAR ADC 120 and amplifies a remaining voltage outputted from the first SAR ADC 110. Hereinafter, an operation of the multistage SAR ADC 110 is described.

Once an analog input voltage Vin is inputted, the first SAR ADC 110 performs an n-bit analog digital converting operation. Then, the remaining voltage amplifier 130 amplifies a remaining voltage after the n-bit analog digital converting operation. The second SAR ADC 120 receives the amplified remaining voltage and performs an m-bit analog digital converting operation through the received voltage. As a result, the analog input voltage Vin is converted into an n+m bit digital signal using the first and second SAR ADCs 110 and 120.

In this case, a consumed time that the multistage SAR ADC 100 converts one analog input voltage Vin into an n+m bit digital signal may be similar to a time consumed in a typical SAR ADC. However, if several analog input voltages are continuously inputted, a time consumed for digital conversion in the multistate SAR ADC 100 becomes shorter than a time consumed in a typical SAR ADC. This is because while the first SAR ADC 110 performs a digital converting operation on an n analog input voltage, the second SAR ADC 120 performs a digital converting operation on an n−1 analog input voltage. This will be described in more detail with reference to FIG. 2.

Figure 2:
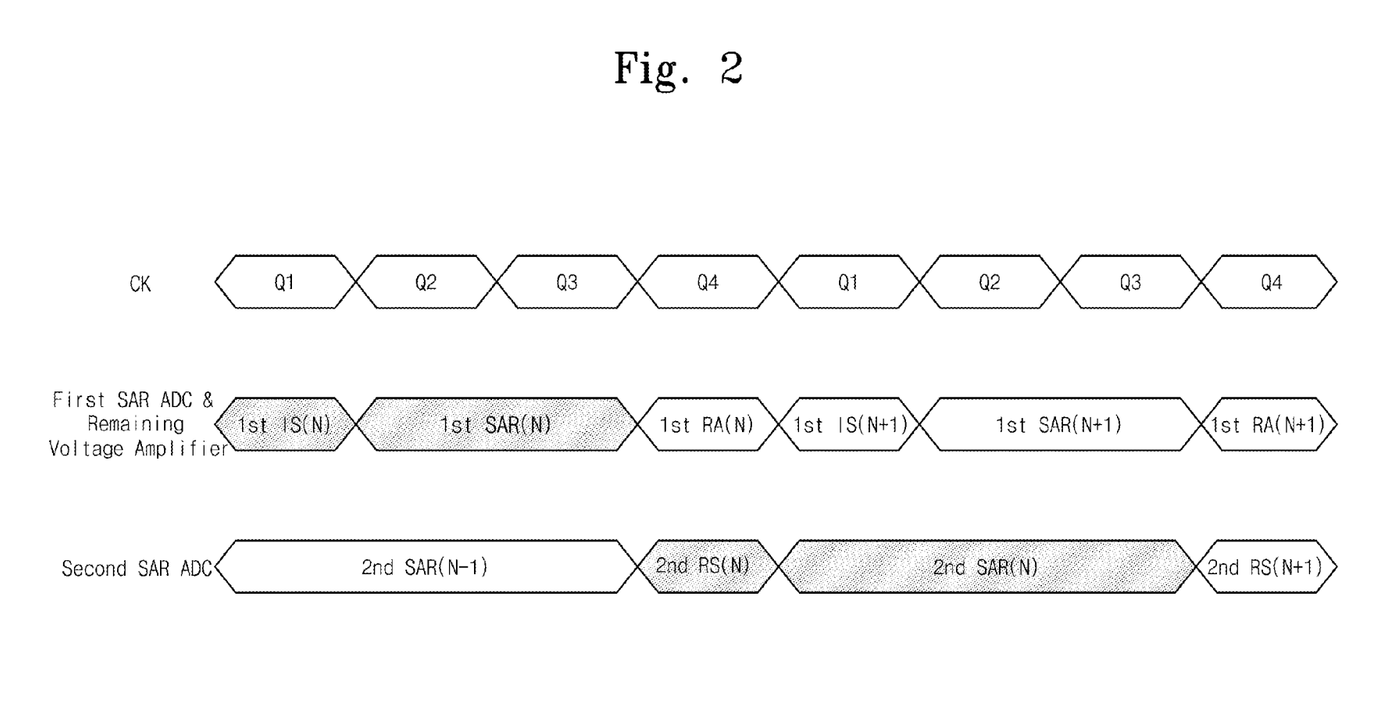
FIG. 2 is a timing diagram illustrating an operation of the multistage SAR ADC of FIG. 1.

FIG. 2 is a timing diagram illustrating an operation of the multistage SAR ADC 100 of FIG. 1. Referring to FIG. 2, the SAR ADC 100 operates in response to a clock signal CK. In FIG. 2, exemplarily, it is assumed that the multistage SAR ADC 100 operates in response to four clocks Q1 to Q4.

Referring to FIGS. 1 and 2, the first SAR ADC 110 samples an nth analog signal (n is an integer greater than 1) during the clock Q1 and performs an analog digital converting operation during the clocks Q2 and Q3. The remaining voltage amplifier 130 amplifies a remaining voltage outputted from the first SAR ADC 110. The second SAR ADC 120 performs a digital converting operation on an n−1th analog signal during the clocks Q1, Q2, and Q3 and samples a remaining voltage outputted from the remaining voltage amplifier 130 during the clock Q4.

This operation repeats by a period of four clocks. Accordingly, when analog input signals are continuously inputted, while the second SAR ADC 120 performs a digital converting operation on an n−1th analog input signal, the first SAR ADC 110 may perform a digital converting operation on an nth analog input signal. As a result, a time consumed for performing a digital converting operation in the multistage SAR ADC 100 becomes shorter than a time consumed for performing a digital converting operation in a typical SAR ADC.

Moreover, a digital converting time in the multistage SAR ADC 100 of FIG. 1 is determined by a resolution of the multistage SAR ADC and one bit converting time. In this case, a 1 bit converting time is determined by manufacturing processes of an SAR ADC. As a result, a digital converting time of the multistage SAR ADC 100 is increased as its resolution is increased. Hereinafter, another embodiment of the present invention for reducing a digital converting time of a multistage SAR ADC with the same resolution will be described in more detail.

Figure 3:
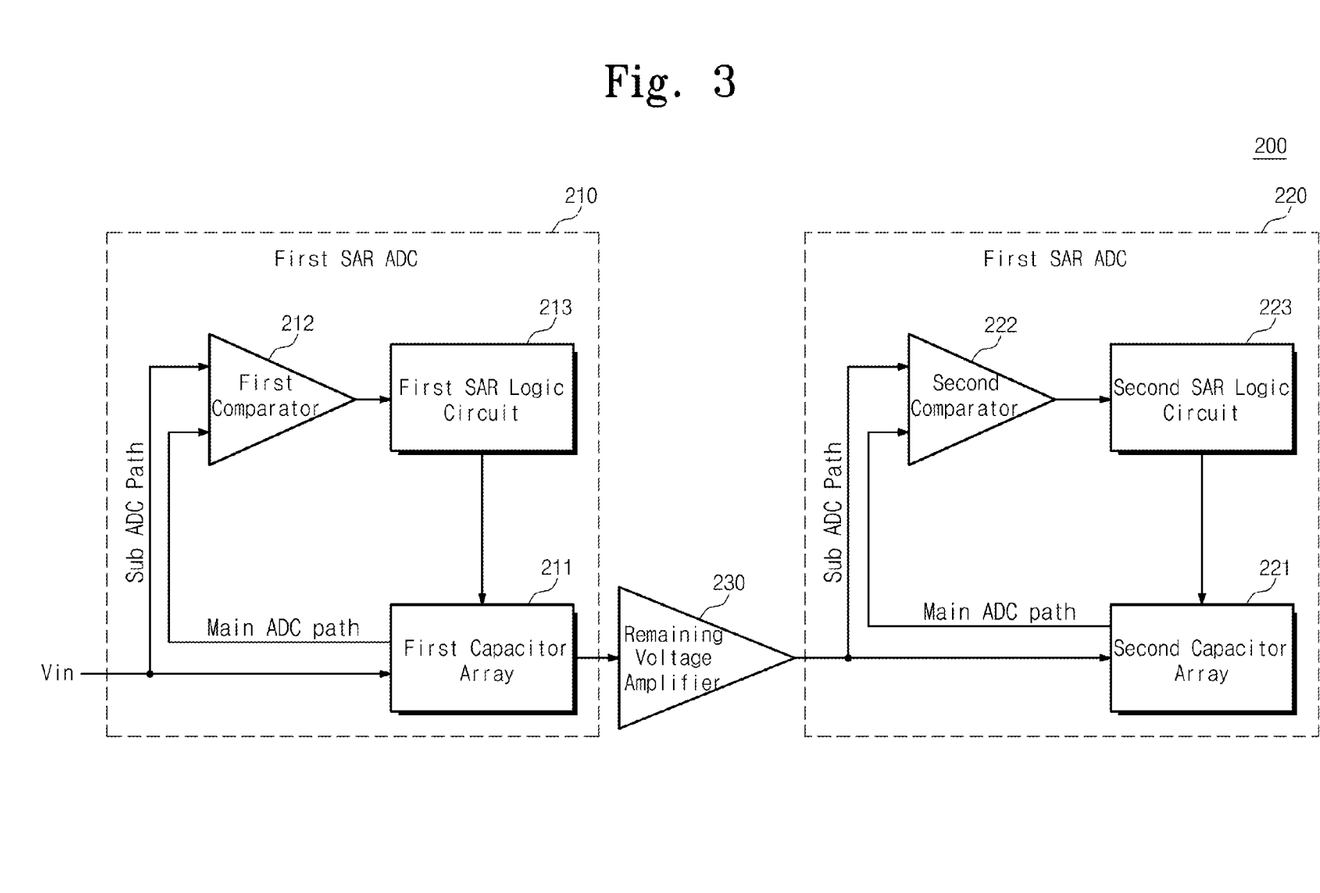
FIG. 3 is a block diagram illustrating a multistage SAR ADC according to another embodiment of the present invention.

FIG. 3 is a block diagram illustrating a multistage SAR ADC 200 according to another embodiment of the present invention. A configuration of the multistage SAR ADC 200 of FIG. 3 is similar to that of the multistage SAR ADC 100 of FIG. 1. Accordingly, difference with respect to the multistage SAR ADC 100 of FIG. 1 will be mainly described. Referring to FIG. 3, the multistage SAR ADC 200 includes a first SAR ADC 210, a second SAR ADC 220, and a remaining voltage amplifier 230.

In the first and second SAR ADCs 210 and 220, the first and second comparators 212 and 222 receive an analog input voltage Vin and an output voltage, respectively. While the first and second capacitor arrays 211 and 221 perform a sampling operation, each of the first and second comparators 212 and 222 outputs a compare signal with respect to an analog input voltage Vin and an output voltage of the remaining voltage amplifier 230. The first and second SAR logic circuits 213 and 223 receive a comparison result and determine a digital bit through the received comparison result.

While a sampling operation is performed, since a part of a digital converting operation is performed using the first and second comparators 212 and 222, the multistage SAR ADC 200 has a less consumed time for a digital converting operation than the multistage SAR ADC 100 of FIG. 1.

To be more specific, first, an analog input voltage Vin is provided to the first capacitor array 211 and the first comparator 212. The first capacitor array 211 performs a sampling operation using the analog input voltage Vin. Since an operation of the first capacitor 211 is similar to that 111 of FIG. 1, its detailed description will be omitted.

While the first capacitor array 211 performs a sampling operation, the first comparator 212 receives an analog input signal Vin and outputs a compare signal. The first SAR logic circuit 213 receives a comparison result from the first comparator 212 and performs a digital converting operation of more than 1 bit. That is, while a sampling operation is performed, since the analog input voltage Vin maintains a predetermined level, an operation for converting the analog input voltage Vin into a digital bit is partially performed using the first comparator 212.

A digital converting operation performed using the first comparator 212 while the first capacitor array 211 performs a sampling operation may be referred to as a sub analog digital converting operation (i.e., a sub ADC operation). Additionally, a path through which an analog input voltage Vin is provided to the first comparator 212 may be referred to as a sub ADC path.

Once a sampling operation is completed in the first capacitor array 211, the sub ADC path is cut off and a main ADC path is formed. Then, a main analog digital converting operation (hereinafter, a main ADC operation) is performed. Here, the main ADC operation means an operation determining a bit other than a digital bit determined in the sub ADC operation. Additionally, the main ADC path means a path formed between the first capacitor array 211 and the first comparator 212 to perform the main ADC operation.

For convenience of description, it is assumed that the first SAR ADC 210 converts an analog input signal Vin into an n-bit digital signal. Additionally, it is assumed that the first comparator 212 performs a 1-bit digital converting operation during a sampling operation.

In this case, since a 1-bit digital converting operation is performed during a sub ADC operation, the main ADC operation performs an n−1 bit digital converting operation. As a result, a time consumed for performing a digital converting operation in the first SAR ADC 210 of FIG. 3 becomes shorter than a time consumed for performing a digital converting operation in the first SAR ADC 110.

Moreover, since the main ADC operation is similar to the digital converting operation described with reference to FIGS. 1 and 2, its detailed description will be omitted. Additionally, since an operation of the second SAR ADC 220 is similar to that of the first SAR ADC 210, its detailed description will be omitted.

Figure 4:
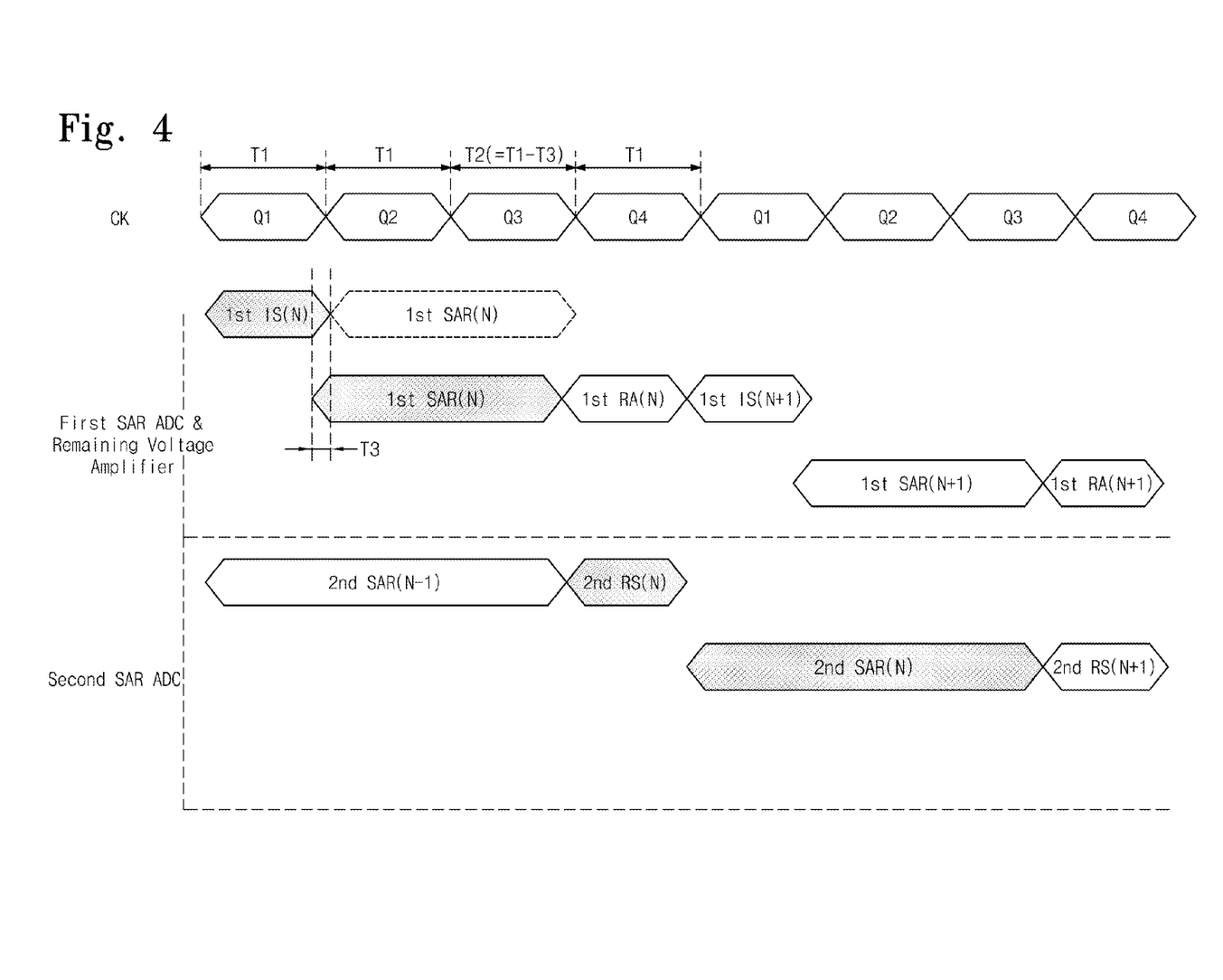
FIG. 4 is a timing diagram illustrating an operation of the multistage SAR ADC of FIG. 3.

FIG. 4 is a timing diagram illustrating an operation of the multistage SAR ADC 200 of FIG. 3. Referring to FIG. 4, the multistage SAR ADC 200 operates in response to a clock signal CK. For convenience of description, like FIG. 2, it is assumed that the multistage SAR ADC 200 operates in response to four clocks Q1 to Q4 in FIG. 4.

Referring to FIGS. 3 and 4, the first SAR ADC 210 samples an nth analog signal (n is an integer greater than 1) during clock Q1. While a sampling operation is performed, the first comparator 212 of the first SAR ADAC 210 performs a sub ADC operation of more than 1 bit. That is, a sub ADC operation is performed during the clock Q1. Then, the first SAR ADC 210 performs a main ADC operation during the clocks Q2 and Q3.

Since a part of a digital converting operation for an analog input voltage Vin is performed in the sub ADC operation, a time consumed for performing a main ADC operation becomes shorter according to a digital bit converted during the sub ADC operation. Accordingly, a duration time of the clocks Q2 and Q3 necessary for performing a main ADC operation may be set less than that of the SAR ADC 110 of FIG. 1.

For example, it is assumed that the first SAR ADC 110 of FIG. 1 performs a digital converting operation during the clocks Q2 and Q3 and each of the clocks Q2 and Q3 lasts for T1. In this case, as shown in FIG. 4, duration times of the clocks Q2 and Q3 for performing a main ADC operation in the first SAR ADC 210 of FIG. 3 may be wet with T1 and T2, respectively. That is, the duration time of the clock Q3 may be reduced by T3. As a result, a timed consumed for performing an n-bit digital converting operation on an analog input voltage Vin in the first SAR ADC 210 may be reduced by T3 compared to the first SAR ADC 110 of FIG. 1.

Moreover, the remaining voltage amplifier 230 amplifies a remaining voltage outputted from the first SAR ADC 210 during the clock Q4. The second SAR ADC 220 performs a digital converting operation on an n−1th analog signal during the clocks Q1, Q2, and Q3 and samples a remaining voltage outputted from the remaining voltage amplifier 130 during the clock Q4. This operation repeats by a period of four clocks.

As mentioned above, the multistage SAR ADC 200 of FIG. 3 supports a sub ADC operation. Accordingly, the multistage SAR ADC 200 of FIG. 3 performs a fast digital converting operation with the same resolution compared to the multistage SAR ADC 100 of FIG. 1.

Figure 5:
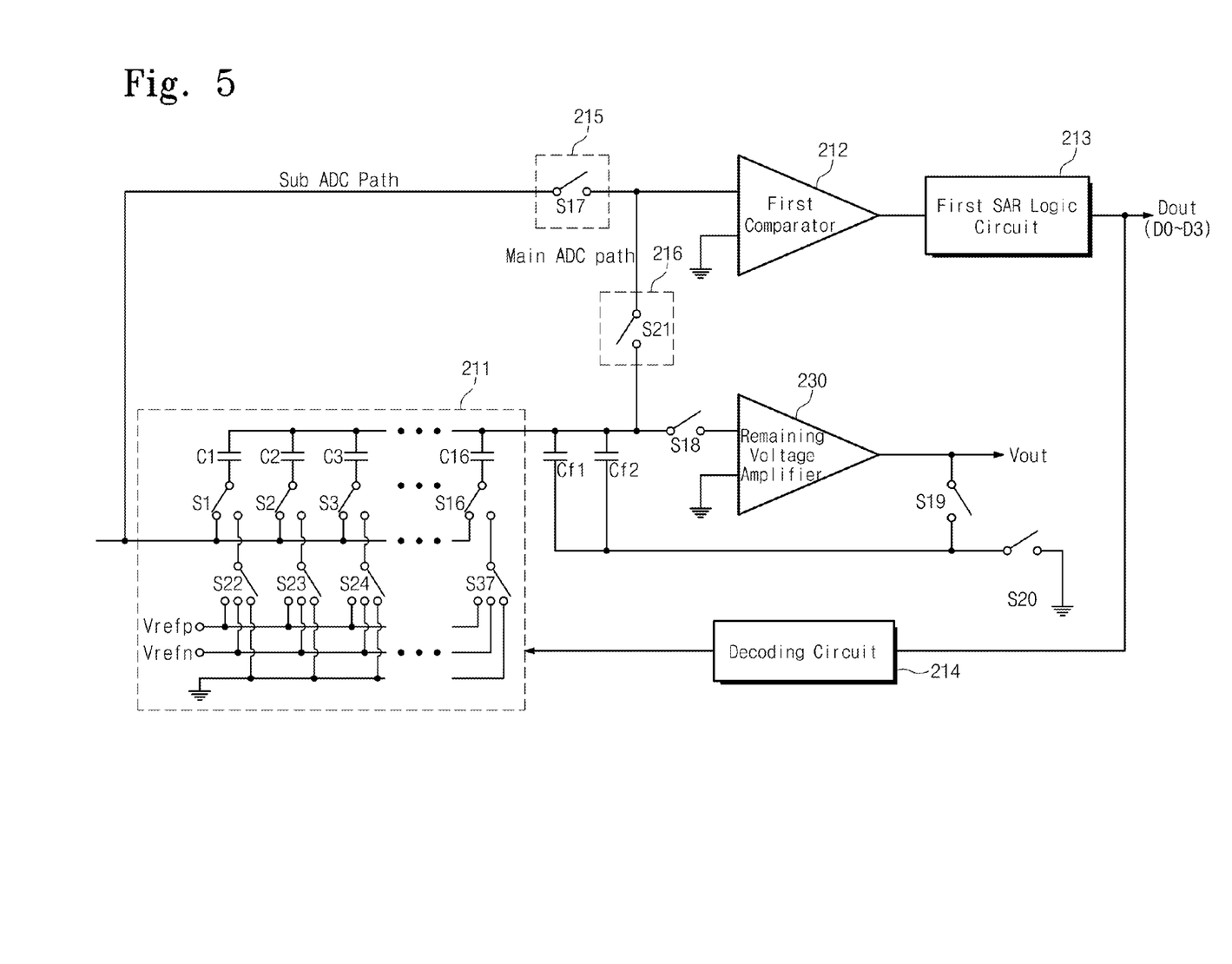
FIG. 5 is a detailed view illustrating a structure of the multistage SAR ADC of FIG. 3.

FIG. 5 is a detailed view illustrating a structure of the multistage SAR ADC 200 of FIG. 3. In FIG. 5, a structure of the first SAR ADC 210 and a connection relationship between the first SAR ADC 210 and the remaining current amplifier 230 are described in detail.

Referring to FIG. 5, the first SAR ADC 210 includes a first capacitor 211, a first comparator 212, a first SAR logic circuit 213, a decoding circuit 214, a sub ADC connection circuit 215, and a main ADC connection circuit 216.

The first capacitor array 211 receives an analog input voltage Vin and samples it. The first capacitor array 211 includes a plurality of capacitors and a plurality of switches. In FIG. 5, exemplarily, the first capacitor array 211 includes sixteen capacitors C1 to C16 and thus supports a 4-bit digital converting operation. The capacitors C1 to C16 have respectively different capacitances. For example, the capacitances of the capacitors C1 to C16 may be increased by $2^n$.

The capacitors C1 to C16 are connected to an analog input voltage Vin through the respective switches S1 to S16. While a sampling operation is performed, the switches S1 to S16 are turned on and the analog input voltage Vin is accumulated in the capacitors C1 to C16.

Additionally, the capacitors C1 to C16 are connected to a first reference voltage Vrefn, a second reference voltage Vrefp, and a ground voltage through the switches S22 to S37. That is, while the main ADC is performed, the switches S22 to S37 are connected to one of the first reference voltage Vrefn, the second reference voltage Vrefp, and the ground voltage through the switches S22 to S37. In this case, a level voltage is generated through a charge redistribution method.

The first comparator 212 is connected to an analog input voltage Vin through the sub ADC connection circuit 215. Additionally, the first comparator 212 is connected to the first capacitor array 211 through the main ADC connection circuit 216. The first comparator 212 outputs a compare signal of the received signal and delivers it to the first SAR logic circuit 213. The first SAR logic circuit 213 receives a compare signal and determines a digital bit by a 1 bit unit.

In FIG. 5, it is shown that the sub ADC connection circuit 215 and the main ADC connection circuit 216 are realized with the switches S17 and S21, respectively. However, this is just exemplary and thus the sub ADC connection circuit 215 and the main ADC connection circuit 216 may be realized with a multiplexer.

When a sampling operation is performed, the sub ADC connection circuit 215 is turned on and the main ADC connection circuit 216 is turned off Accordingly, the first comparator 212 receives an analog input voltage Vin through a sub ADC path. While the sampling operation is performed, the first comparator 212 compares the analog input voltage Vin with a predetermined voltage (e.g., a ground voltage) and then outputs a compare signal. The first SAR logic circuit 213 receives the compare signal and determined a part of a digital bit (e.g., a digital bit of more than 1) of the analog input voltage Vin. That is, the sub ADC operation is performed while the sampling operation is performed.

Once the sampling operation is completed, the sub ADC connection circuit 215 is turned on and the main ADC connection circuit 216 is turned on. Accordingly, the first compactor 212 receives a level voltage through a main ADC path and outputs a comparison result. The first SAR logic circuit 213 receives the comparison result and determines a digital bit of the analog input voltage Vin. That is, the main ADC operation is performed.

In the main ADC operation, the first comparator 212 an the first SAR logic circuit 213 determine digital bits other than a digital bit determined during the sub ADC operation. For example, when the most significant bit (MSB) is determined during the sampling operation, the first comparator 212 an the first SAR logic circuit 213 may determine digital bits from the next bit of the MSB to the least significant bit (LSB).

Moreover, the decoding circuit 214 receives an output signal of the first SAR logic circuit 213. The decoding circuit 214 controls the switches S22 to S37 based on the received result of the first SAR logic circuit 213. Then, an operation for determining each bit value from the next bit to the LSB is repeatedly performed.

Once the main ADC operation is completed, the switches S18 and S19 are turned on and the switches S17, S21, and S20 are turned off. Accordingly, the first capacitor array 211 is connected to the remaining voltage amplifier 230 and the remaining voltage amplifier 230 amplifies the remaining voltage and provides it to the second SAR ADC 220 of FIG. 3.

As mentioned above, the multistage SAR ADC 200 determines a digital bit of more than 1 using a comparator while the sampling operation is performed. Accordingly, a time consumed for converting an analog input voltage Vin into a digital signal may be reduced. However, FIGS. 3 through 5 are understood as exemplary ones and the technical scopes of the present invention are not limited thereto. Hereinafter, an embodiment of a multistage SAR ADC using a sub ADC circuit instead of a comparator will be described with reference to FIG. 6.

Figure 6:
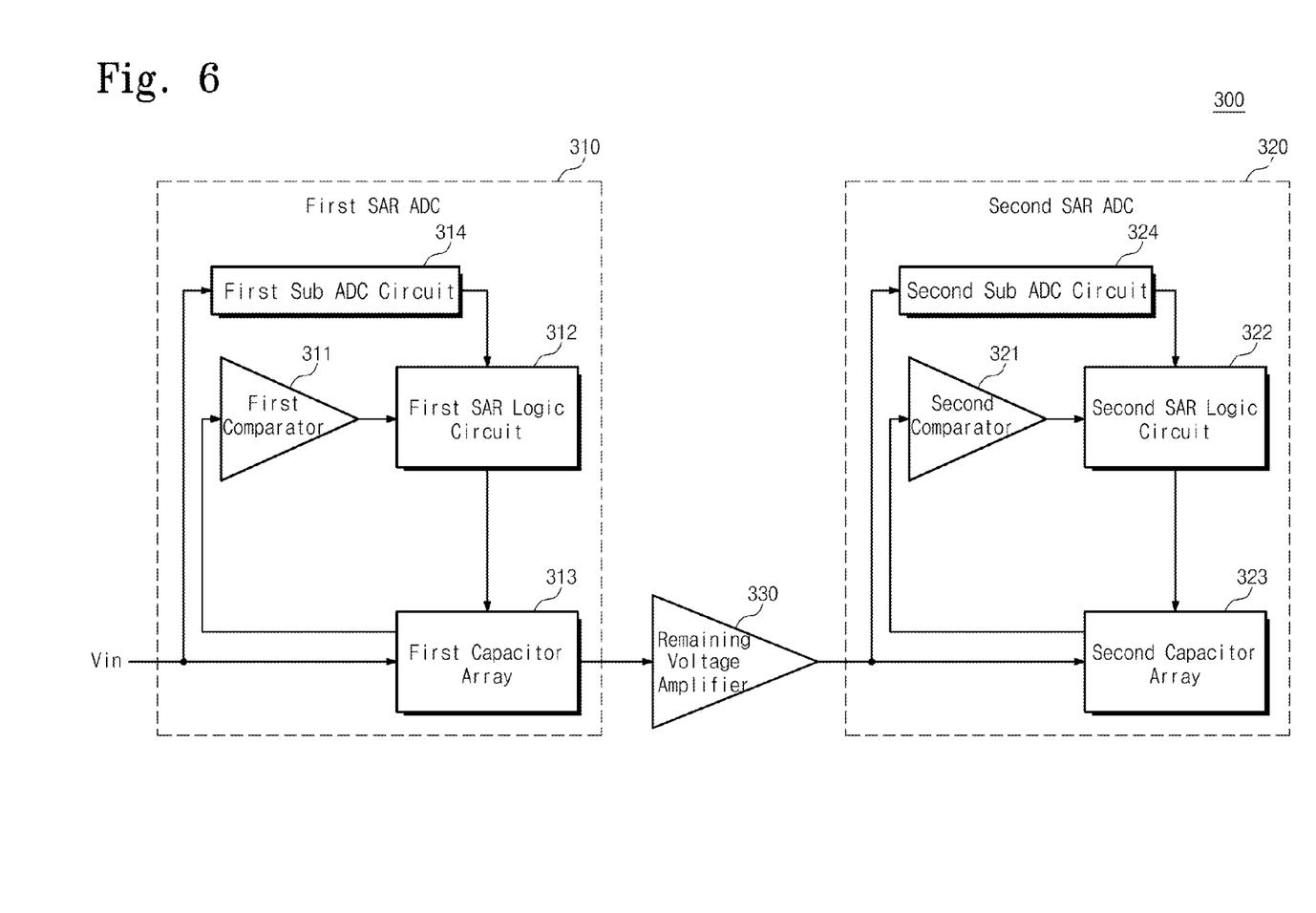
FIG. 6 is a block diagram illustrating a multistage SAR ADC according to another embodiment of the present invention.

FIG. 6 is a block diagram illustrating a multistage SAR ADC 300 according to another embodiment of the present invention. A configuration of the multistage SAR ADC 300 of FIG. 3 is similar to that of the multistage SAR ADC 300 of FIG. 3. Accordingly, differences with respect to the multistage SAR ADC 300 of FIG. 3 will be mainly described. Referring to FIG. 6, the multistage SAR ADC 300 includes a first SAR ADC 310, a second SAR ADC 320, and a remaining current amplifier 330.

Unlike the multistage SAR ADC 200 of FIG. 3, the SAR ADC 300 of FIG. 5 performs a sub ADC operation while the sub ADC circuits 314 and 324 perform a sampling operation. That is, the first and second SAR ADCs 310 and 320 include the first and second sub ADC circuits 314 and 324, respectively, and the first and second sub ADC circuits 314 and 324 receives an analog input voltage Vin and an output voltage of the remaining voltage amplifier 330, respectively.

While the first and second capacitor arrays 313 and 323 perform a sampling operation, the first and second sub ADC circuits 314 and 324 perform a digital converting operation of more than 1 bit. Accordingly, similar to the multistate SAR ADC 200 of FIG. 3, a time consumed for a digital converting operation may be reduced in the multistate SAR ADC 300 of FIG. 5.

In this case, the first and second ADC circuits 314 and 324 may be realized with various forms. For example, the first and second ADC circuits 314 and 324 may be realized with a flash ADC or a pipeline ADC.

An ADC according to an embodiment of the present invention performs an analog digital converting operation during a sampling operation, so that a time consumed for digital conversion may be reduced.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An analog digital converter (ADC) comprising:
   a capacitor array generating a level voltage;
   a comparator outputting a compare signal by comparing the level voltage; and
   a logic circuit determining digital bits of an analog signal based on the compare signal,
   wherein the logic circuit determines at least one digital bit among digital bits of the analog signal while a sampling operation of the analog signal is performed in the capacitor array.

2. The ADC of claim 1, further comprising a connection circuit connected between the comparator and an input node of the analog signal, wherein the connection circuit is turned on while the sampling operation of the analog signal is performed in the capacitor array.

3. The ADC of claim 1, further comprising:
   a first connection circuit connected between the comparator and an input node of the analog signal; and
   a second connection circuit connected between the comparator and the capacitor array,
   wherein the first connection circuit is turned on and the second connection circuit is turned off while the sampling operation of the analog signal is performed in the capacitor array.

4. The ADC of claim 3, wherein after the sampling operation of the analog signal is completed in the capacitor array, the first connection circuit is turned off and the second connection circuit is turned on.

5. The ADC of claim 1, further comprising a sub analog digital converting circuit connected to an input node of the analog signal and the logic circuit, wherein the sub analog digital converting circuit determines at least one bit of digital bits of the analog signal while the sampling operation of the analog signal is performed in the capacitor array.

6. The ADC of claim 5, wherein the sub analog digital converting circuit is realized with a flash ADC.

7. The ADC of claim 1, wherein the capacitor array comprises:

a plurality of capacitors sampling the analog signal; and a plurality of switches connected to the plurality of capacitors, wherein after a sampling operation is completed, the plurality of switches selectively connect the plurality of capacitors to input nodes of first and second reference voltages to generate the level voltage.

8. An ADC comprising:

a first successive approximation register (SAR) ADC converting an analog input signal into a digital signal of a predetermined bit; and a second SAR ADC converting a remaining voltage of the first SAR ADC into a digital signal of a predetermined bit, wherein the first SAR ADC converts the analog input signal into a digital signal while a sampling operation of the analog input signal is performed; and the second SAR ADC converts the remaining voltage into a digital signal while a sampling operation of the remaining voltage is performed.

9. The ADC of claim 8, wherein the first and second SAR ADCs generate a sub analog digital converting path supporting an analog digital converting operation while a sampling operation is performed and a main analog digital converting path supporting an analog digital converting operation after a sampling operation is performed, respectively.

10. The ADC of claim 9, wherein while a sampling operation is performed, the main analog digital converting path of the first and second SAR ADCs is cut off.

11. The ADC of claim 10, wherein after a sampling operation is completed, the sub analog digital converting path of the first and second SAR ADCs is cut off.

12. The ADC of claim 8, wherein the first and second SAR ADCs perform an analog digital converting operation using respective comparators while a sampling operation is performed.

13. The ADC of claim 8, wherein the first and second SAR ADCs perform an analog digital converting operation using respective flash ADCs while a sampling operation is performed.

* * * * *